United States Patent
Deng et al.

(10) Patent No.: US 12,426,414 B2
(45) Date of Patent: Sep. 23, 2025

(54) REACTIVE ORGANOSILICON THIXOTROPIC AGENT, ORGANOSILICON ENCAPSULATION ADHESIVE AND LED ELEMENT

(71) Applicant: Beijing KMT Technology Co., Ltd., Beijing (CN)

(72) Inventors: Zuozhu Deng, Beijing (CN); Jing Ma, Beijing (CN); Huijuan Liu, Beijing (CN)

(73) Assignee: Beijing KMT Technology Co., Ltd., Beijing (CN)

( * ) Notice: Subject to any disclaimer, the term of this patent is extended or adjusted under 35 U.S.C. 154(b) by 860 days.

(21) Appl. No.: 17/554,044

(22) Filed: Dec. 17, 2021

(65) Prior Publication Data

US 2022/0204827 A1    Jun. 30, 2022

(30) Foreign Application Priority Data

Dec. 30, 2020 (CN) .......................... 202011611398.4

(51) Int. Cl.
    *H10H 20/854* (2025.01)
    *C09J 183/04* (2006.01)
    *H10K 50/84* (2023.01)

(52) U.S. Cl.
    CPC .......... *H10H 20/854* (2025.01); *C09J 183/04* (2013.01); *H10K 50/84* (2023.02)

(58) Field of Classification Search
    None
    See application file for complete search history.

(56) References Cited

U.S. PATENT DOCUMENTS

2013/0090429 A1* 4/2013 Zhang ............... C08G 18/4829
                                                  524/590
2014/0309372 A1* 10/2014 Vyakaranam ........ C08G 18/289
                                                  525/102

FOREIGN PATENT DOCUMENTS

| CN | 103937257 A |   | 7/2014 |
| CN | 111718486 A |   | 9/2020 |
| JP | 08120085 A  | * | 5/1996 |

OTHER PUBLICATIONS

JP 08120085 A (Year: 1996).*
Standard GB/T 1701-2001 Ebonite—Determination of tensile strength and elongation at break.
Standard GB/T 13936-92 Rubber, vulcanized—Method for determination of strength properties of adhesive to metal in shear by tension loading.
Standard GB/T 2411-2008 Plastics and ebonite—Determination of indentation hardness by means of a durometer (shore hardness).

* cited by examiner

*Primary Examiner* — Jeffrey D Washville

(57) ABSTRACT

Disclosed is a reactive organosilicon thixotropic agent, an organosilicon encapsulation adhesive containing the reactive organosilicon thixotropic agent, and an LED element encapsulated by using the organosilicon encapsulation adhesive. In the present disclosure, the reactive organosilicon thixotropic agent is prepared by a hydrosilylation reaction of cyclic hydrogen-containing polysiloxane or branched hydrogen-containing polysiloxane that contains phenyl with unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1, can provides the organosilicon encapsulation adhesive with stable thixotropic property, high transparency, and excellent mechanical property and adhesion property at the same time, and thus an LED element having great encapsulation property is manufactured.

10 Claims, No Drawings

REACTIVE ORGANOSILICON THIXOTROPIC AGENT, ORGANOSILICON ENCAPSULATION ADHESIVE AND LED ELEMENT

CROSS-REFERENCE TO RELATED APPLICATION

The present disclosure claims the priority of Chinese Patent Application No. 202011611398.4, filed on Dec. 30, 2020 and entitled "Reactive organosilicon thixotropic agent, organosilicon encapsulation adhesive and LED element", which is incorporated herein by reference in its entirety.

FIELD OF THE INVENTION

The present disclosure relates to an organosilicon thixotropic agent, in particular to a reactive organosilicon thixotropic agent, and also relates to an organosilicon encapsulation adhesive containing the reactive organosilicon thixotropic agent, and an LED element encapsulated by using the organosilicon encapsulation adhesive.

BACKGROUND OF THE INVENTION

Recently, as market demands for ultra-high-definition televisions, advanced displays, etc. increase quickly, the new LED display technology such as mini LED, micro LED, etc. has developed rapidly. When such LED elements are encapsulated, in order to facilitate machining, it is generally necessary to use an organosilicon encapsulation adhesive having thixotropy, so as to ensure that the organosilicon encapsulation adhesive can directly be shaped, and the shape of the shaped organosilicon encapsulation adhesive remains basically unchanged before and after encapsulation and curing.

In general, it is possible to add fillers such as silicon dioxide, carbon black, organic bentonite, etc. to the organosilicon encapsulation adhesive in order to obtain suitable thixotropy. However, these fillers are difficult to uniformly disperse in the organosilicon encapsulation adhesive, and are extremely easily settled after long-term storage, which results in the thixotropic property of the organosilicon encapsulation adhesive being unstable, and impairs the transparency of the encapsulation adhesive.

CN103937257A, CN111718486A, etc. disclose performing a hydrosilylation reaction by using a hydrogen-containing polysiloxane with a modifier having an olefinic bond, such as allyl glycidyl ether, butyl acrylate, allyl polyoxyethylene ether, etc., so as to prepare an organosilicon thixotropic agent. Although these organosilicon thixotropic agents can improve the thixotropic stability of an organosilicon encapsulation adhesive after cooperating with fillers, the compatibility between the organosilicon thixotropic agent and an organosilicon encapsulation adhesive matrix (especially the matrix containing phenyl) is often poor, resulting in the encapsulated product being easily turbid, such that it is difficult to obtain desired high transparency. Moreover, the addition of the organosilicon thixotropic agent is generally not beneficial to the improvement of the mechanical property and the adhesion property of the organosilicon encapsulation adhesive.

Therefore, it is urgently required to develop an organosilicon thixotropic agent that can provides the organosilicon encapsulation adhesive with stable thixotropic property, high transparency, and excellent mechanical property and adhesion property at the same time.

SUMMARY OF THE INVENTION

One of the aims of the present disclosure is to provide a reactive organosilicon thixotropic agent, which can provide the organosilicon encapsulation adhesive with stable thixotropic property, high transparency, and excellent mechanical property and adhesion property at the same time.

Another aim of the present disclosure is to provide an organosilicon encapsulation adhesive containing the reactive organosilicon thixotropic agent.

Still another aim of the present disclosure is to provide an LED element prepared by encapsulation using the organosilicon encapsulation adhesive.

In one aspect, the present disclosure provides a reactive organosilicon thixotropic agent, which is prepared by a hydrosilylation reaction of cyclic hydrogen-containing polysiloxane as represented by formula (1) or branched hydrogen-containing polysiloxane as represented by formula (2) with unsaturated polyether as represented by formula (3) under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1.

$$(R^{1a}R^{1b}SiO_{2/2})_{n1}(R^{1c}HSiO_{2/2})_{n2} \quad \text{formula (1)}$$

In formula (1), $R^{1a}$, $R^{1b}$ and $R^{1c}$ are each independently one of a hydrogen atom, methyl and phenyl, and at least one of $R^{1a}$, $R^{1b}$ and $R^{1c}$ is phenyl; and n1 is an integer from 0 to 10, and n2 is an integer from 2 to 10;

$$(R^{2a}R^{2b}R^{2c}SiO_{1/2})_{n3}(R^{2d}R^{2e}HSiO_{1/2})_{n4}(R^{2f}R^{2g}SiO_{2/2})_{n5}(R^{2h}SiO_{3/2})_{n6}(SiO_{4/2})_{n7} \quad \text{formula (2)}$$

In formula (2), $R^{2a}$, $R^{2b}$, $R^{2c}$, $R^{2d}$, $R^{2e}$, $R^{2f}$, $R^{2g}$ and $R^{2h}$ are each independently one of a hydrogen atom, methyl and phenyl, and at least one of $R^{2a}$, $R^{2b}$, $R^{2c}$, $R^{2d}$, $R^{2e}$, $R^{2f}$, $R^{2g}$ and $R^{2h}$ is phenyl; and n3 is an integer from 0 to 10, n4 is an integer from 2 to 10, n5 is an integer from 0 to 10, n6 is an integer from 0 to 10, n7 is an integer from 0 to 10, and n6+n7≥1;

$$AO(BO)_mH \quad \text{formula (3)}$$

In formula (3), A is one of ethenyl, propenyl, allyl, acrylyl and methacryloyl, each B is independently one of alkylenes from C1 to C10, and m is an integer from 1 to 50.

With regard to the reactive organosilicon thixotropic agent according to the present disclosure, the cyclic hydrogen-containing polysiloxane preferably has a structure as represented by the following formula (1-1):

$$(R^{1c}HSiO_{2/2})_{n2} \quad \text{formula (1-1)}$$

In formula (1-1), $R^{1c}$ is each independently one of a hydrogen atom, methyl and phenyl, and at least one $R^{1c}$ is phenyl; and n2 is an integer from 3 to 10.

With regard to the reactive organosilicon thixotropic agent according to the present disclosure, the branched hydrogen-containing polysiloxane preferably has a structure as represented by the following formula (2-1):

$$(R^{2d}R^{2e}HSiO_{1/2})_{n4}(R^{2h}SiO_{3/2})_{n6} \quad \text{formula (2-1)}$$

In formula (2-1), $R^{2d}$, $R^{2e}$ and $R^{2h}$ are each independently one of a hydrogen atom, methyl and phenyl, and at least one of $R^{2d}$, $R^{2e}$ and $R^{2h}$ is phenyl; and n4 is an integer from 2 to 10, and n6 is an integer from 1 to 10.

With regard to the reactive organosilicon thixotropic agent according to the present disclosure, in formula (3), preferably, A is allyl, and B is one of alkylenes from C1 to C4.

In another aspect, the present disclosure also provides an organosilicon encapsulation adhesive, which contains:
(A) organic polysiloxane, each molecule of which has at least two SiVi bonds and contains phenyl;
(B) hydrogen-containing polysiloxane, each molecule of which has at least two SiH bonds and contains phenyl;
(C) a hydrosilylation reaction catalyst;
(D) a filler; and
(E) the reactive organosilicon thixotropic agent according to the present disclosure.

With regard to the organosilicon encapsulation adhesive according to the present disclosure, preferably, the filler (D) is one or more of silicon dioxide, magnesium oxide, aluminium oxide, zinc oxide and titanium oxide.

With regard to the organosilicon encapsulation adhesive according to the present disclosure, preferably, the particle size of the filler (D) is 1 nm to 500 nm.

With regard to the organosilicon encapsulation adhesive according to the present disclosure, preferably, the BET specific surface area of the filler (D) is $100\ m^2/g$ to $800\ m^2/g$.

Preferably, the organosilicon encapsulation adhesive according to the present disclosure contains:
50 to 90 percent by mass of the organic polysiloxane (A);
1 to 40 percent by mass of the hydrogen-containing polysiloxane (B);
0.1 ppm to 500 ppm of the hydrosilylation reaction catalyst (C);
0.5 to 20 percent by mass of the filler (D);
0.05 to 10 percent by mass of the reactive organosilicon thixotropic agent (E);
0 to 10 percent by mass of a tackifier (F); and
0 to 5 percent by mass of a hydrosilylation reaction inhibitor (G).

In further aspect, the present disclosure also provides an LED element, which is prepared by encapsulation using the organosilicon encapsulation adhesive of the present disclosure.

The present disclosure has unexpectedly found that the reactive organosilicon thixotropic agent, which is prepared by a hydrosilylation reaction of cyclic hydrogen-containing polysiloxane or branched hydrogen-containing polysiloxane that contains phenyl with unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1, can provides the organosilicon encapsulation adhesive with stable thixotropic property, high transparency, and excellent mechanical property and adhesion property at the same time, and thus an LED element having great encapsulation property is manufactured.

DETAILED DESCRIPTION OF THE EMBODIMENTS

The present disclosure will be further described below in conjunction with the particular embodiments, but the scope of protection of the present disclosure is not limited to this.

Description of Terms

The word "reactive" in the expression "reactive organosilicon thixotropic agent" mentioned in the present disclosure refers to the activity capable of participating in a hydrosilylation reaction. Unless otherwise specified, each "reactive" mentioned in the present disclosure originates from SiH bonds present in the molecular structure of the reactive organosilicon thixotropic agent. In the present disclosure, it is ensured that the ratio of the total quantity of SiH bonds in the cyclic hydrogen-containing polysiloxane or the branched hydrogen-containing polysiloxane to the total quantity of olefinic bonds in the unsaturated polyether is greater than 1, such that some of the SiH bonds are reserved in the molecular construction of the prepared reactive organosilicon thixotropic agent.

Unless otherwise specified, the expression "curing" or "curing reaction" mentioned in the present disclosure when describing the organosilicon encapsulation adhesive has substantively the same meaning as the hydrosilylation reaction.

Unless otherwise specified, various properties mentioned in the present disclosure when describing the organosilicon encapsulation adhesive are all obtained by curing the organosilicon encapsulation adhesive and then measuring the cured product of the organosilicon encapsulation adhesive. Certainly, in order to better describe the beneficial properties of the organosilicon encapsulation adhesive of the present disclosure during a formulation process or before curing, the properties of the organosilicon encapsulation adhesive are also measured before curing sometimes.

Unless otherwise specified, the weight percentage, i.e. "percent by mass", mentioned in the present disclosure when describing contents of various components of the organosilicon encapsulation adhesive is taking the sum of the contents of the various components of the organosilicon encapsulation adhesive of the present disclosure as 100 percent by mass.

The "ppm" mentioned in the present disclosure refers to content (or concentration) in parts per million by mass, and unless otherwise specified, is taking the sum of the contents of the various components of the organosilicon encapsulation adhesive of the present disclosure as 100 percent by mass. In the present disclosure, when "ppm" is used to represent the content of a hydrosilylation reaction catalyst, unless otherwise specified, the "ppm" is calculated according to the proportion of the mass of active metal atoms in the hydrosilylation reaction catalyst in the sum of the mass of the various component of the organosilicon encapsulation adhesive. For example, when a platinum catalyst is used, the content of the platinum catalyst is calculated according to the proportion of the mass of platinum atoms in the sum of the mass of the various component of the organosilicon encapsulation adhesive.

The expression "the BET specific surface area" mentioned in the present disclosure refers to the total specific surface area occupied by per unit mass of particles that is measured by the BET method, which is well known in the art, and has a unit being $m^2/g$.

In the present disclosure, "Me" mentioned represents methyl, "Vi" mentioned represents ethenyl, "Ph" mentioned represents phenyl, "SiH bond" mentioned represents a covalent bond formed by a hydrogen atom being directly bonded to a silicon atom, and "SiVi bond" mentioned represents a covalent bond formed by ethenyl being directly bonded to a silicon atom.

Reactive Organosilicon Thixotropic Agent

The present disclosure provides a reactive organosilicon thixotropic agent, which is prepared by a hydrosilylation reaction of cyclic hydrogen-containing polysiloxane as represented by formula (1) or branched hydrogen-containing polysiloxane as represented by formula (2) with unsaturated polyether as represented by formula (3) under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1;

$$(R^1{}_2SiO_{2/2})_{n1}(R^1HSiO_{2/2})_{n2} \qquad (1)$$

In formula (1), $R^1$ each independently represents a hydrogen atom, methyl or phenyl, and at least one $R^1$ is phenyl; and n1 represents an integer from 0 to 10, and n2 represents an integer from 2 to 10;

$$(R^2{}_3SiO_{1/2})_{n3}(R^2{}_2HSiO_{1/2})_{n4}(R^2{}_2SiO_{2/2})_{n5}(R^2SiO_{3/2})_{n6}(SiO_{4/2})_{n7} \qquad (2)$$

In formula (2), $R^2$ each independently represents a hydrogen atom, methyl or phenyl, and at least one $R^2$ is phenyl; and n3 represents an integer from 0 to 10, n4 represents an integer from 2 to 10, n5 represents an integer from 0 to 10, n6 represents an integer from 0 to 10, n7 represents an integer from 0 to 10, and n6+n7≥1;

$$AO(BO)_mH \qquad (3)$$

In formula (3), A represents ethenyl, propenyl, allyl or (meth)acryloyl, B each independently represents one of alkylenes from C1 to C10, and m represents an integer from 1 to 50.

The present disclosure has found that a reactive organosilicon thixotropic agent, which is prepared by a hydrosilylation reaction of cyclic hydrogen-containing polysiloxane or branched hydrogen-containing polysiloxane that contains phenyl with unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1, can provides the organosilicon encapsulation adhesive with stable thixotropic property, high transparency, and excellent mechanical property and adhesion property at the same time.

Cyclic Hydrogen-containing Polysiloxane

In the present invention, the cyclic hydrogen-containing polysiloxane has a cyclic structure, phenyl, and a sufficient amount of SiH bonds that can participate in a hydrosilylation reaction, so as to introduce, by a hydrosilylation reaction with the unsaturated polyether, the cyclic structure, the phenyl, and residual SiH bonds that do not participate in the hydrosilylation reaction into the molecular structure of the reactive organosilicon thixotropic agent of the present disclosure that is prepared by the hydrosilylation reaction. For the organosilicon encapsulation adhesive of the present disclosure that contains the reactive organosilicon thixotropic agent, the introduction of phenyl can provide the reactive organosilicon thixotropic agent with great compatibility between same and the organosilicon encapsulation adhesive matrix, and with a high refraction index that matches the refraction index of the filler in the organosilicon encapsulation adhesive, so as to provide the organosilicon encapsulation adhesive of the present disclosure with excellent transparency; the introduction of the SiH bonds enables the reactive organosilicon thixotropic agent to participate in a curing reaction of the organosilicon encapsulation adhesive, and compared with a non-reactive organosilicon thixotropic agent, can provide the organosilicon encapsulation adhesive of the present disclosure with more excellent mechanical property and adhesion property; and the introduction of the cyclic structure, compared with an organosilicon thixotropic agent having a linear structure, can provide the organosilicon encapsulation adhesive of the present disclosure with more excellent thixotropic property, and further improve the mechanical property and adhesion property of the organosilicon encapsulation adhesive.

Based on the above considerations, in the present disclosure, the cyclic hydrogen-containing polysiloxane has the structure as represented by formula (1):

$$(R^{1a}R^{1b}SiO_{2/2})_{n1}(R^{1c}HSiO_{2/2})_{n2} \qquad \text{formula (1)}$$

In formula (1), $R^{1a}$, $R^{1b}$ and $R^{1c}$ are each independently one of a hydrogen atom, methyl and phenyl, and at least one of $R^{1a}$, $R^{1b}$ and $R^{1c}$ is phenyl; and n1 is an integer from 0 to 10, preferably an integer from 0 to 6, and n2 is an integer from 2 to 10, preferably an integer from 2 to 6.

Preferably, the cyclic hydrogen-containing polysiloxane has the structure as represented by formula (1-1):

$$(R^{1c}HSiO_{2/2})_{n2} \qquad \text{formula (1-1)}$$

In formula (1-1), $R^{1c}$ each independently represents one of a hydrogen atom, methyl and phenyl, and at least one $R^{1c}$ is phenyl; and n2 is an integer from 3 to 10, preferably an integer from 3 to 6.

More preferably, the cyclic hydrogen-containing polysiloxane has the structure as represented by formula (1-1a), (1-1b) or (1-1c):

$$(PhHSiO_{2/2})_3 \qquad \text{formula (1-1a)}$$

$$(PhSHiO_{2/2})_4 \qquad \text{formula (1-1b)}$$

$$(PhHSiO_{2/2})_5 \qquad \text{formula (1-1c)}$$

Branched Hydrogen-Containing Polysiloxane

In the present invention, the branched hydrogen-containing polysiloxane has a branched structure, phenyl, and a sufficient amount of SiH bonds that can participate in a hydrosilylation reaction, so as to introduce, by a hydrosilylation reaction with the unsaturated polyether, the branched structure, the phenyl, and residual SiH bonds that do not participate in the hydrosilylation reaction into the molecular structure of the reactive organosilicon thixotropic agent of the present disclosure that is prepared by the hydrosilylation reaction. For the organosilicon encapsulation adhesive of the present disclosure that contains the reactive organosilicon thixotropic agent, the introduction of phenyl can provide the reactive organosilicon thixotropic agent with great compatibility between same and the organosilicon encapsulation adhesive matrix, and with a high refraction index that matches the refraction index of the filler in the organosilicon encapsulation adhesive, so as to provide the organosilicon encapsulation adhesive of the present disclosure with excellent transparency; the introduction of the SiH bonds enables the reactive organosilicon thixotropic agent to participate in a curing reaction of the organosilicon encapsulation adhesive, and compared with a non-reactive organosilicon thixotropic agent, can provide the organosilicon encapsulation adhesive of the present disclosure with more excellent mechanical property and adhesion property; and the introduction of the branched structure, compared with an organosilicon thixotropic agent having a linear structure, can provide the organosilicon encapsulation adhesive of the present disclosure with more excellent thixotropic property, and further improve the mechanical property and adhesion property of the organosilicon encapsulation adhesive.

Based on the above considerations, in the present disclosure, the branched hydrogen-containing polysiloxane has the structure as represented by formula (2):

$$(R^{2a}R^{2b}R^{2c}SiO_{1/2})_{n3}(R^{2d}R^{2e}HSiO_{1/2})_{n4}(R^{2f}R^{2g}SiO_{2/2})_{n5}(R^{2h}SiO_{3/2})_{n6}(SiO_{4/2})_{n7} \quad \text{formula (2)}$$

In formula (2), $R^{2a}$, $R^{2b}$, $R^{2c}$, $R^{2d}$, $R^{2e}$, $R^{2f}$, $R^{2g}$ and $R^{2h}$ are each independently one of a hydrogen atom, methyl and phenyl, and at least one of $R^{2a}$, $R^{2b}$, $R^{2c}$, $R^{2d}$, $R^{2e}$, $R^{2f}$, $R^{2g}$ and $R^{2h}$ is phenyl; and n3 is an integer from 0 to 10, preferably an integer from 0 to 6, n4 is an integer from 2 to 10, preferably an integer from 2 to 6, n5 is an integer from 0 to 10, preferably an integer from 0 to 6, n6 is an integer from 0 to 10, preferably an integer from 0 to 6, n7 is an integer from 0 to 10, preferably an integer from 0 to 6, and n6+n7≥1.

Preferably, the branched hydrogen-containing polysiloxane has the structure as represented by formula (2-1):

$$(R^{2d}R^{2e}HSiO_{1/2})_{n4}(R^{2h}SiO_{3/2})_{n6} \quad \text{formula (2-1)}$$

In formula (2-1), $R^{2d}$, $R^{2e}$ and $R^{2h}$ are each independently one of a hydrogen atom, methyl and phenyl, and at least one of $R^{2d}$, $R^{2e}$ and $R^{2h}$ is phenyl; and n4 is an integer from 2 to 10, preferably an integer from 2 to 6, and n6 is an integer from 1 to 10, preferably an integer from 1 to 6.

More preferably, the branched hydrogen-containing polysiloxane has the structure as represented by formula (2-1a), (2-1b) or (2-1c):

$$(Me_2HSiO_{1/2})_{n4}(PhSiO_{3/2})_{n6} \quad \text{formula (2-1a)}$$

In formula (2-1a), n4 represents an integer from 2 to 10, preferably an integer from 2 to 6, and n6 represents an integer from 1 to 10, preferably an integer from 1 to 6;

$$(Ph_2HSiO_{1/2})_{n4}(MeSiO_{3/2})_{n6} \quad \text{formula (2-1b)}$$

In formula (2-1b), n4 represents an integer from 2 to 10, preferably an integer from 2 to 6, and n6 represents an integer from 1 to 10, preferably an integer from 1 to 6;

$$(Ph_2HSiO_{1/2})_{n4}(PhSiO_{3/2})_{n6} \quad \text{formula (2-1c)}$$

In formula (2-1c), n4 represents an integer from 2 to 10, preferably an integer from 2 to 6, and n6 represents an integer from 1 to 10, preferably an integer from 1 to 6.

Unsaturated Polyether

In the present disclosure, the unsaturated polyether has a polyether structure and olefinic bond (—CH═CH— and/or CH$_2$═CH—), so as to introduce, by a hydrosilylation reaction with the cyclic hydrogen-containing polysiloxane or branched hydrogen-containing polysiloxane, the polyether structure into the molecular structure of the reactive organosilicon thixotropic agent of the present disclosure. For the organosilicon encapsulation adhesive of the present disclosure that contains the reactive organosilicon thixotropic agent, the introduction of the polyether structure can provide the organosilicon encapsulation adhesive of the present disclosure with excellent thixotropic property.

In the present disclosure, the unsaturated polyether has the structure as represented by formula (3):

$$AO(BO)_mH \quad \text{formula (3)}$$

In formula (3), A is one of ethenyl, propenyl, allyl, acrylyl and methacryloyl, preferably ethenyl or allyl, and more preferably allyl; each B is independently one of alkylenes from C1 to C10, preferably one of alkylenes from C1 to C4, and more preferably one of ethylidene and propylidene; and m is an integer from 1 to 50, preferably an integer from 1 to 30, and more preferably an integer from 1 to 20.

Preferably, the unsaturated polyether has the structure as represented by formula (3a), (3b), (3c), (3d) or (3e):

$$CH_2\!=\!CHCH_2O(CH_2CH_2O)_{m1}H \quad \text{formula (3a)}$$

In formula (3a), m1 is an integer from 1 to 50, preferably an integer from 1 to 30, and more preferably an integer from 1 to 20;

$$CH_2\!=\!CHCH_2O(CH_2CH_2CH_2O)_{m2}H \quad \text{formula (3b)}$$

In formula (3b), m2 is an integer from 1 to 50, preferably an integer from 1 to 30, and more preferably an integer from 1 to 20;

$$CH_2\!=\!CHCH_2O(CH_2CH_2O)_{m3}(CH_2CH_2CH_2O)_{m4}H \quad \text{formula (3c)}$$

In formula (3c), m3 is an integer from 1 to 25, preferably an integer from 1 to 15, and more preferably an integer from 1 to 10; and m4 is an integer from 1 to 25, preferably an integer from 1 to 15, and more preferably an integer from 1 to 10;

$$CH_2\!=\!CHCH_2O(CH_2CH_2CH_2O)_{m5}(CH_2CH_2O)_{m6}H \quad \text{formula (3d)}$$

In formula (3d), m5 is an integer from 1 to 25, preferably an integer from 1 to 15, and more preferably an integer from 1 to 10; and m6 is an integer from 1 to 25, preferably an integer from 1 to 15, and more preferably an integer from 1 to 10;

$$CH_2\!=\!CHCH_2O(CH_2CH_2O)_{m7}(CH_2CH_2CH_2O)_{m8}(CH_2CH_2O)_{m9}H \quad \text{formula (3e)}$$

In formula (3e), m7 is an integer from 1 to 15, preferably an integer from 1 to 10, and more preferably an integer from 1 to 5; m8 is an integer from 1 to 15, preferably an integer from 1 to 10, and more preferably an integer from 1 to 5; and m9 is an integer from 1 to 15, preferably an integer from 1 to 10, and more preferably an integer from 1 to 5.

A Method for Preparing a Reactive Organosilicon Thixotropic Agent

The present disclosure also provides a method for preparing a reactive organosilicon thixotropic agent, the method including: conducting a hydrosilylation reaction of the cyclic hydrogen-containing polysiloxane or the branched hydrogen-containing polysiloxane with the unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1.

In order to facilitate the smooth conduction of the reaction, in the present disclosure, the hydrosilylation reaction is preferably conducted under the presence of a hydrosilylation reaction catalyst. In the present disclosure, the type of the hydrosilylation reaction catalyst is not particularly limited, and types that are well known in the art can be used. The instances of the hydrosilylation reaction catalyst include, but not limited to: a platinum-containing compound, such as chloroplatinic acid, a reaction product of chloroplatinic acid and alcohols compound, a platinum-alkene complex, a platinum-vinylsilane complex, a platinum-ketone complex and a platinum-phosphine complex; a rhodium-containing compound, such as a rhodium-phosphine complex and a rhodium-sulfur compound complex; and a palladium-containing compound, such as a palladium-phosphine complex. In order to improve catalytic activity, the hydrosilylation reaction catalyst can be supported on a carrier. The instances of the carrier include, but not limited to silicon dioxide, aluminium oxide, carbon black, etc. In the present disclosure, the amount of the hydrosilylation reaction catalyst used is also not particularly limited, where it is only necessary to facilitate the smooth conduction of the hydrosilylation reaction.

In the present disclosure, the hydrosilylation reaction can be conducted under the presence of an organic solvent, and can also be conducted under the absence of a solvent. However, in order to facilitate full dissolution and uniform reaction of reaction raw materials, in the present disclosure, the hydrosilylation reaction is preferably conducted under the presence of an organic solvent. In the present disclosure, the type of organic solvent is not particularly limited, and types that are well known in the art can be used. The instances of the organic solvent include, but not limited to: pentane, hexane, octane, cyclohexane, benzene, methylbenzene, xylene, chlorobenzene, dichlorobenzene, dichloromethane, chloroform, methanol, ethyl alcohol, isopropanol, diethyl ether, tetrahydrofuran, acetone, cyclohexanone, methyl acetate, ethyl acetate, propyl acetate, ethylene glycol monomethyl ether, ethylene glycol monoethyl ether, ethylene glycol monobutyl ether, N,N-dimethylformamide, dimethyl sulfoxide, acetonitrile, etc. Preferably, the organic solvent is methanol, ethyl alcohol, methylbenzene, xylene or cyclohexane.

In the present disclosure, the reaction temperature and reaction time of the hydrosilylation reaction are not particularly limited, and reaction conditions that are well known in the art can be used.

Organosilicon Encapsulation Adhesive

The present disclosure also provides an organosilicon encapsulation adhesive, which contains:
  (A) organic polysiloxane, each molecule of which has at least two SiVi bonds and contains phenyl;
  (B) hydrogen-containing polysiloxane, each molecule of which has at least two SiH bonds and contains phenyl;
  (C) a hydrosilylation reaction catalyst;
  (D) a filler; and
  (E) the reactive organosilicon thixotropic agent of the present disclosure.

In the present disclosure, the reactive organosilicon thixotropic agent can provide an organosilicon encapsulation adhesive with stable thixotropic property, high transparency, and excellent mechanical property and adhesion property at the same time, and thus an LED element having great encapsulation property is manufactured.

Preferably, the organosilicon encapsulation adhesive of the present disclosure contains:
  50 to 90 percent by mass of the organic polysiloxane (A);
  1 to 40 percent by mass of the hydrogen-containing polysiloxane (B);
  0.1 ppm to 500 ppm of the hydrosilylation reaction catalyst (C);
  0.5 to 20 percent by mass of the filler (D);
  0.05 to 10 percent by mass of the reactive organosilicon thixotropic agent (E);
  0 to 10 percent by mass of a tackifier (F); and
  0 to 5 percent by mass of a hydrosilylation reaction inhibitor (G).

More preferably, the organosilicon encapsulation adhesive of the present disclosure contains:
  60 to 80 percent by mass of the organic polysiloxane (A);
  10 to 35 percent by mass of the hydrogen-containing polysiloxane (B);
  0.5 ppm to 200 ppm of the hydrosilylation reaction catalyst (C);
  1 to 10 percent by mass of the filler (D);
  0.1 to 5 percent by mass of the reactive organosilicon thixotropic agent (E);
  0.1 to 5 percent by mass of a tackifier (F); and
  0.001 to 1 percent by mass of a hydrosilylation reaction inhibitor (G).

Organic Polysiloxane (A)

Organic polysiloxane is generally used as a resin matrix in an organosilicon encapsulation adhesive. A hydrosilylation reaction of SiVi bonds in the molecular structure of the organic polysiloxane with SiH bonds in the molecular structure of hydrogen-containing polysiloxane as a cross-linking agent is conducted, such that the organosilicon encapsulation adhesive is cured during an LED encapsulation process.

Therefore, the organosilicon encapsulation adhesive of the present disclosure contains: organic polysiloxane (A), each molecule of which has at least two SiVi bonds and contains phenyl.

In the present disclosure, the content of phenyl in the organic polysiloxane (A) is preferably 1 to 50 percent by mass, and more preferably 5 to 40 percent by mass.

In the present disclosure, the content of SiVi bonds in the organic polysiloxane (A) is preferably 0.01 to 10 mmol/g, and more preferably 0.5 to 5 mmol/g.

In the present disclosure, the type of the organic polysiloxane (A) is not particularly limited, and types that are well known in the art can be used. The instances of the organic polysiloxane (A) includes, but not limited to a linear organosilicon polysiloxane, a branched organosilicon polysiloxane or a combination of them.

Preferably, the organic polysiloxane (A) has the structure as represented in formula (4):

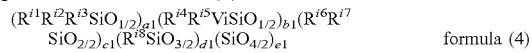
$(R^{i1}R^{i2}R^{i3}SiO_{1/2})_{a1}(R^{i4}R^{i5}ViSiO_{1/2})_{b1}(R^{i6}R^{i7}SiO_{2/2})_{c1}(R^{i8}SiO_{3/2})_{d1}(SiO_{4/2})_{e1}$  formula (4)

In formula (4), $R^{i1}$, $R^{i2}$, $R^{i3}$, $R^{i4}$, $R^{i5}$, $R^{i6}$, $R^{i7}$ and $R^{i8}$ are each independently methyl or phenyl; a1 is a number satisfying $0 \le a1 < 0.3$, and preferably a number satisfying $0 \le a1 < 0.1$; b1 is a number satisfying $0.1 < b1 < 0.95$, and preferably a number satisfying $0.3 < b1 < 0.9$; c1 is a number satisfying $0 \le c1 < 1.2$, and preferably a number satisfying $0.3 < c1 < 1.0$; d1 is a number satisfying $0.1 < d1 < 1.5$, and preferably a number satisfying $0.4 < d1 < 1.2$; and e1 is a number satisfying $0 \le e1 < 0.3$, and preferably a number satisfying $0 \le e1 < 0.1$.

In the organosilicon encapsulation adhesive of the present disclosure, the content of the organic polysiloxane (A) is preferably 50 to 90 percent by mass, and more preferably 60 to 90 percent by mass.

Hydrogen-Containing Polysiloxane (B)

Hydrogen-containing polysiloxane is generally used as a cross-linking agent in an organosilicon encapsulation adhesive. A hydrosilylation reaction of SiH bonds in the molecular structure of the hydrogen-containing polysiloxane with SiVi bonds in the molecular structure of organic polysiloxane as a resin matrix is conducted, such that the organosilicon encapsulation adhesive is cured during an LED encapsulation process.

Therefore, the organosilicon encapsulation adhesive of the present disclosure contains: hydrogen-containing polysiloxane (B), each molecule of which has at least two hydrogen atoms bonded to silicon atoms.

In the present disclosure, the content of phenyl in the hydrogen-containing polysiloxane (B) is preferably 5 to 60 percent by mass, and more preferably 15 to 55 percent by mass.

In the present disclosure, the content of SiH bonds in the hydrogen-containing polysiloxane (B) is preferably 0.01 to 10 mmol/g, and more preferably 3 to 8 mmol/g.

In the present disclosure, the type of the hydrogen-containing polysiloxane (B) is not particularly limited, and types that are well known in the art can be used. The instances of the hydrogen-containing polysiloxane (B) includes, but not limited to a linear hydrogen-containing polysiloxane, a branched hydrogen-containing polysiloxane or a combination of them.

Preferably, the hydrogen-containing polysiloxane (B) has the structure as represented in formula (5):

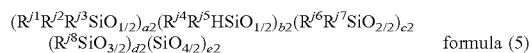

formula (5)

In formula (5), $R^{j1}$, $R^{j2}$, $R^{j3}$, $R^{j4}$, $R^{j5}$, $R^{j6}$, $R^{j7}$ and $R^{j8}$ are each independently methyl or phenyl; a2 is a number satisfying $0 \leq a2 < 0.3$, and preferably a number satisfying $0 \leq a2 < 0.1$; b2 is a number satisfying $0.1 < b2 < 1$, and preferably a number satisfying $0.3 < b2 < 1$; c2 is a number satisfying $0 \leq c2 < 1.2$, and preferably a number satisfying $0.3 < c2 < 1.0$; d2 is a number satisfying $0 \leq d2 < 1.5$, and preferably a number satisfying $0 \leq d2 < 1$; and e2 is a number satisfying $0 \leq e2 < 0.3$, and preferably a number satisfying $0 \leq e2 < 0.1$.

In the organosilicon encapsulation adhesive of the present disclosure, the content of the hydrogen-containing polysiloxane (B) is preferably 1 to 40 percent by mass, and more preferably 10 to 35 percent by mass.

Hydrosilylation Reaction Catalyst (C)

A hydrosilylation reaction catalyst is generally used in an organosilicon encapsulation adhesive for catalyzing the smooth conduction of a hydrosilylation reaction of SiVi bonds in the molecular structure of organic polysiloxane serving as a resin matrix with SiH bonds in the molecular structure of hydrogen-containing polysiloxane serving as a cross-linking agent.

Therefore, the organosilicon encapsulation adhesive of the present disclosure also contains: a hydrosilylation reaction catalyst (C).

In the present disclosure, the type of the hydrosilylation reaction catalyst (C) is not particularly limited, and types that are well known in the art can be used. The instances of the hydrosilylation reaction catalyst (C) include, but not limited to: a platinum-containing compound, such as chloroplatinic acid, a reaction product of chloroplatinic acid and alcohols, a platinum-alkene complex, a platinum-vinylsilane complex, a platinum-ketone complex and a platinum-phosphine complex; a rhodium-containing compound, such as a rhodium-phosphine complex and a rhodium-sulfur compound complex; and a palladium-containing compound, such as a palladium-phosphine complex. In order to improve catalytic activity, the hydrosilylation reaction catalyst (C) can be supported on a carrier. The instances of the carrier include, but not limited to silicon dioxide, aluminium oxide, carbon, such as carbon black, activated carbon or carbon nanotubes, etc. In some specific embodiments of the invention, the carrier is carbon black. Preferably, the hydrosilylation reaction catalyst (C) is a complex of platinum and vinylsiloxane, and more preferably platinum(0)-1,3-divinyl-1,1,3,3-tetramethyldisiloxane complex.

In the organosilicon encapsulation adhesive of the present disclosure, the content of the hydrosilylation reaction catalyst (C) is not particularly limited, however, from the perspective of being conducive to promoting the curing of the organosilicon encapsulation adhesive, the content of the organosilicon encapsulation adhesive (C) is preferably 0.1 to 500 ppm, and more preferably 0.5 to 200 ppm.

Filler (D)

A filler is generally used in an organosilicon encapsulation adhesive for providing basic thixotropic property and suitable mechanical property. In the present disclosure, the use of the filler in cooperation with the reactive organosilicon thixotropic agent can provide the organosilicon encapsulation adhesive of the present disclosure with excellent thixotropic property.

Therefore, the organosilicon encapsulation adhesive of the present disclosure also contains: a filler (D).

In the present disclosure, the type of the filler (D) is not particularly limited, however, from the perspective of the easy acquisition of a raw material, the filler (D) is preferably one or more of silicon dioxide, magnesium oxide, aluminium oxide, zinc oxide and titanium oxide, and more preferably fumed silicon dioxide.

In the present disclosure, the particle size of the filler (D) is not particularly limited, however, from the perspective of being conducive to improving optical property of the organosilicon encapsulation adhesive, the particle size of the filler (D) is preferably 1 to 500 nm, and more preferably 1 to 200 nm.

In the present disclosure, the BET specific surface area of the filler (D) is not particularly limited, however, from the perspective of being conducive to improving thixotropic property of the organosilicon encapsulation adhesive, the BET specific surface area of the filler (D) is preferably 100 to 800 m$^2$/g, and more preferably 150 to 600 m$^2$/g.

In the present disclosure, the content of the filler (D) in the organosilicon encapsulation adhesive is not particularly limited, however, from the perspective of being conducive to improving thixotropic property of the organosilicon encapsulation adhesive, the content of the filler (D) in the organosilicon encapsulation adhesive is preferably 0.5 to 20 percent by mass, and more preferably 1 to 10 percent by mass.

Reactive Organosilicon Thixotropic Agent (E)

In the present disclosure, the addition of the reactive organosilicon thixotropic agent of the present disclosure into the organosilicon encapsulation adhesive can provide the organosilicon encapsulation adhesive with stable thixotropic property, high transparency, and excellent mechanical property and adhesion property at the same time.

Therefore, the organosilicon encapsulation adhesive of the present disclosure also contains: the reactive organosilicon thixotropic agent (E).

In the organosilicon encapsulation adhesive of the present disclosure, the content of the reactive organosilicon thixotropic agent (E) is preferably 0.05 to 10 percent by mass, and more preferably 0.1 to 5 percent by mass.

Tackifier (F)

A tackifier is generally used in the organosilicon encapsulation adhesive for improving adhesion property.

Therefore, optionally, the organosilicon encapsulation adhesive of the present disclosure can further contain: a tackifier (F).

The type of the tackifier (F) is not particularly limited, and types that are well known in the art can be selected. The instances of the tackifier (F) include, but not limited to: a silane coupling agent or a titanate coupling agent. The silane coupling agent may be: one or more of vinyl trimethoxysilane, vinyl triethoxysilane, 3-(2,3-epoxypropoxy)propyl trimethoxysilane, 3-(2,3-epoxypropoxy)propyl triethoxysilane, acryloyloxy propyl trimethoxysilane, acryloyloxy triethoxysilane, methacryloyl trimethoxysilane, methacryloyl triethoxysilane, mercaptopropyl trimethoxysilane, mercaptopropyl triethoxysilane, isocyanurate propyl trimethoxysilane, isocyanurate propyl triethoxysilane. The titanate coupling agent may be: one or more of tetramethyl titanate, tetraethyl titanate, tetra-n-propyl titanate, tetra-n-butyl titanate, tetra-n-pentyl titanate, tetra-n-hexyl titanate, tetra-n-heptyl titanate, tetra-isooctyl titanate, tetra-n-nonyl titanate, tetra-n-decyl titanate, and isomers thereof.

In the organosilicon encapsulation adhesive of the present disclosure, the content of the tackifier (F) is not particularly limited, however, from the perspective of being conducive to improving adhesion property of the organosilicon encapsulation adhesive, the content of the tackifier (F) is preferably 0 to 10 percent by mass, and more preferably 0.1 to 5 percent by mass.

Hydrosilylation Reaction Inhibitor (G)

A hydrosilylation reaction inhibitor is generally used in the organosilicon encapsulation adhesive for regulating the speed of a hydrosilylation reaction, so as to control the curing rate of the organosilicon encapsulation adhesive.

Therefore, optionally, the organosilicon encapsulation adhesive of the present disclosure can further contain: a hydrosilylation reaction inhibitor (G).

In the present disclosure, the type of the hydrosilylation reaction inhibitor (G) is not particularly limited, and types that are well known in the art can be used. The instances of the hydrosilylation reaction inhibitor (G) include, but not limited to: a phosphorus-containing compound, such as triphenylphosphine; a nitrogen-containing compound, such as tributylamine, tetramethyl ethylene diamine, benzotriazole, etc.; a maleic acid derivative, such as dimethyl maleate, etc.; alkynol, such as 1-ethynylcyclohexanol, 3,5-dimethyl-1-hexyne-3-alcohol, 3-methylbutynol, etc.; and vinylsilane, such as 1,3,5,7-tetramethyl-1,3,5,7-tetraethylcyclotetrasiloxane, etc. Preferably, the hydrosilylation reaction inhibitor (G) is 1-ethynylcyclohexanol or 1,3,5,7-tetramethyl-1,3,5,7-tetraethylcyclotetrasiloxane.

In the organosilicon encapsulation adhesive of the present disclosure, the content of the hydrosilylation reaction inhibitor (G) is not particularly limited, however, from the perspective of being conducive to regulating the curing rate of the organosilicon encapsulation adhesive, the content of the hydrosilylation reaction inhibitor (G) is preferably 0 to 5 percent by mass, and more preferably 0.001 to 1 percent by mass.

Formulation of Organosilicon Encapsulation Adhesive

The formulation process of the organosilicon encapsulation adhesive of the present disclosure is not particularly limited, and formulation processes that are well known in the art can be used. For example, formulation can be performed in a single-component manner, that is, the organic polysiloxane (A), the hydrogen-containing polysiloxane (B), the hydrosilylation reaction catalyst (C), the filler (D), the reactive organosilicon thixotropic agent (E), the optional tackifier (F), the optional hydrosilylation reaction inhibitor (G) and the optional other components are directly mixed in a mixing device, so that the organosilicon encapsulation adhesive of the present disclosure is prepared in the single-component manner. Formulation can also be performed in a double-component manner, that is, when a condition of not classifying the organic polysiloxane (A), the hydrogen-containing polysiloxane (B) and the hydrosilylation reaction catalyst (C) into the same component is met, the organic polysiloxane (A), the hydrogen-containing polysiloxane (B), the hydrosilylation reaction catalyst (C), the filler (D), the reactive organosilicon thixotropic agent (E), the optional tackifier (F), the optional hydrosilylation reaction inhibitor (G) and the optional other components are classified into two components and are separately mixed in a mixing device, so that the organosilicon encapsulation adhesive of the present disclosure is prepared in the double-component manner. When an LED is encapsulated, the two components are combined to realize curing.

The type of mixing device is not particularly limited, and device that are well known in the art can be used. The instances of the mixing device include, but not limited to: a spatula, a drum roller, a mechanical stirrer, a three-roller mill, a $\Sigma$ blade mixer, a dough mixer, a planetary mixer, a screw rod, a dissolver, a disk mixer, an extrusion mixer, a vacuum mixer, etc.

In the present disclosure, the curing temperature and curing time of the organosilicon encapsulation adhesive are not particularly limited, and a curing temperature and curing time that are well known in the art can be used.

LED Element

The present disclosure also provides an LED element, which is prepared by encapsulation using the organosilicon encapsulation adhesive. The organosilicon encapsulation adhesive of the present disclosure has stable thixotropic property, high transparency, and excellent mechanical property and adhesion property, and thus an LED element having great encapsulation property is manufactured, and in particular, a mini LED element or micro LED element having great encapsulation property is manufactured.

In the present disclosure, the LED element is preferably a mini LED element or micro LED element. The "mini LED element" mentioned in the present disclosure refers to an LED element having an LED chip size being 50 to 150 micron (μm), and the "micro LED element" mentioned refers to an LED element having an LED chip size being less than 50 micron.

In the present disclosure, the process of encapsulating an LED element by using the organosilicon encapsulation adhesive is not particular limited, and an encapsulation process that is well known in the art can be used, for example, an LED element can be encapsulated by dispensing, screen printing, embossing or coating.

In the present disclosure, the use manner of the organosilicon encapsulation adhesive in LED element encapsulation is not particular limited, and an use manner that is well known in the art can be used, for example, the organosilicon encapsulation adhesive can be used as protective adhesive, box dam adhesive or lens adhesive of the LED element.

EMBODIMENTS

The present disclosure will be further described below in conjunction with the particular embodiments, but the scope of protection of the present disclosure is not limited to these particular embodiments.

Measurement Method

A measurement method for a thixotropic index involves: respectively measuring, by using an MCR rheometer, a shear viscosity (denoted as $SV_1$) of an organosilicon encapsulation adhesive at a temperature of 25° C. and a shear rate of 1/s and a shear viscosity (denoted as $SV_2$) of the organosilicon encapsulation adhesive at a temperature of 25° C. and a shear rate of 10/s, where the ratio of $SV_1$ to $SV_2$ is the thixotropic index. The thixotropic index that is measured when the preparation of the organosilicon encapsulation adhesive is completed is denoted as $TI_0$, and the thixotropic index that is measured after three months after the preparation of the organosilicon encapsulation adhesive is completed is denoted as $TI_3$. By the comparison of the values of the $TI_0$ and $TI_3$, the stability of the thixotropic index is determined.

A measurement method for transparency involves: curing organosilicon encapsulation adhesive at a temperature of 150° C. into a sample piece of thickness of 1 mm, and measuring the transmittance of the sample piece under 450 nm by using a UV-3100PC ultraviolet-visible spectrophotometer. The transparency of the organosilicon encapsulation adhesive is determined from the transmittance.

A measurement method for hardness involves: curing organosilicon encapsulation adhesive at a temperature of 150° C. for one hour, and measuring the hardness of the cured product of the organosilicon encapsulation adhesive by using an EHS5D hardness meter and with reference to standard GBT2411-2008. The hardness measured thereby is Shore D hardness.

A measurement method for tensile strength and elongation involves: curing organosilicon encapsulation adhesive at a temperature of 150° C. for one hour, cutting the cured product of the organosilicon encapsulation adhesive into a standard size with reference to standard GBT1701-2001, and measuring the tensile strength and elongation by using an Instron 2367 universal material testing machine. The mechanical property of the organosilicon encapsulation adhesive is determined from the tensile strength and elongation.

A measurement method for shear strength involves: preparing an aluminum sheet single-lap cut sample piece by using organosilicon encapsulation adhesive and with reference to standard GBT13936-92, and measuring shear strength by using an Instron 2367 universal material testing machine. The adhesion property of the organosilicon encapsulation adhesive is determined from the shear strength.

Synthesis Example 1: Preparation of a Reactive Organosilicon Thixotropic Agent E1

300 ml of methylbenzene, 244 g (0.5 mol) of the cyclic hydrogen-containing polysiloxane as represented as formula (1-1-1), 278 g (1 mol) of the unsaturated polyether as represented as formula (1-1-2) (the ratio of the total quantity of SiH bonds in the cyclic hydrogen-containing polysiloxane to the total quantity of olefinic bonds in the unsaturated polyether is 2:1) and 2 g of a platinum catalyst on carbon (20 ppm based on platinum atoms) were sequentially added into a 1000 ml three-necked flask, uniformly mixed and then reacted at 80° C. for six hours with stirring, the platinum catalyst on carbon was removed by filtering, and the methylbenzene is removed by rotary evaporation, so as to obtain the reactive organosilicon thixotropic agent E1 of the present disclosure, which is a colorless transparent liquid, and dynamic viscosity of which measured at 25° C. is 1570 cps.

(PhHSiO$_{2/2}$)$_4$  formula (1-1-1)

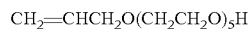
CH$_2$=CHCH$_2$O(CH$_2$CH$_2$O)$_5$H  formula (1-1-2)

Synthesis Example 2: Preparation of a Reactive Organosilicon Thixotropic Agent E2

300 ml of methylbenzene, 297 g (0.9 mol) of the branched hydrogen-containing polysiloxane as represented as formula (2-1-1), 250.2 g (1.5 mol) of the unsaturated polyether as represented as formula (2-1-2) (the ratio of the total quantity of SiH bonds in the cyclic hydrogen-containing polysiloxane to the total quantity of olefinic bonds in the unsaturated polyether is 2:1) and 1.79 g of a platinum catalyst on carbon (20 ppm based on platinum atoms) were sequentially added into a 1000 ml three-necked flask, uniformly mixed and then reacted at 80° C. for six hours with stirring, the platinum catalyst on carbon was removed by filtering, and the methylbenzene is removed by rotary evaporation, so as to obtain the reactive organosilicon thixotropic agent E2 of the present disclosure, which is a colorless transparent liquid, and dynamic viscosity of which measured at 25° C. is 486 cps.

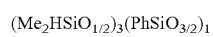
(Me$_2$HSiO$_{1/2}$)$_3$(PhSiO$_{3/2}$)$_1$  formula (2-1-1)

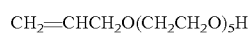
CH$_2$=CHCH$_2$O(CH$_2$CH$_2$O)$_5$H  formula (2-1-2)

Synthesis Example 3: Preparation of a Reactive Organosilicon Thixotropic Agent E3

300 ml of methylbenzene, 210.4 g (0.4 mol) of the branched hydrogen-containing polysiloxane as represented as formula (3-1-1), 222.4 g (0.8 mol) of the unsaturated polyether as represented as formula (3-1-2) (the ratio of the total quantity of SiH bonds in the cyclic hydrogen-containing polysiloxane to the total quantity of olefinic bonds in the unsaturated polyether is 2:1) and 1.73 g of a platinum catalyst on carbon (20 ppm based on platinum atoms) were sequentially added into a 1000 ml three-necked flask, uniformly mixed and then reacted at 80° C. for six hours with stirring, the platinum catalyst on carbon was removed by filtering, and the methylbenzene is removed by rotary evaporation, so as to obtain the reactive organosilicon thixotropic agent E3 of the present disclosure, which is a colorless transparent liquid, and dynamic viscosity of which measured at 25° C. is 1087 cps.

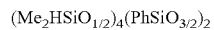
(Me$_2$HSiO$_{1/2}$)$_4$(PhSiO$_{3/2}$)$_2$  formula (3-1-1)

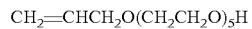
CH$_2$=CHCH$_2$O(CH$_2$CH$_2$O)$_5$H  formula (3-1-2)

Comparative Synthesis Example 1: Preparation of a Reactive Organosilicon Thixotropic Agent CE1

300 ml of methylbenzene, 201 g (0.5 mol) of the branched hydrogen-containing polysiloxane as represented as formula (4-1-1), 278 g (1 mol) of the unsaturated polyether as represented as formula (4-1-2) (the ratio of the total quantity of SiH bonds in the cyclic hydrogen-containing polysiloxane to the total quantity of olefinic bonds in the unsaturated polyether is 2:1) and 1.92 g of a platinum catalyst on carbon (20 ppm based on platinum atoms) were sequentially added into a 1000 ml three-necked flask, uniformly mixed and then reacted at 80° C. for six hours with stirring, the platinum catalyst on carbon was removed by filtering, and the methylbenzene is removed by rotary evaporation, so as to obtain the reactive organosilicon thixotropic agent CE1 of the present disclosure, which is a colorless transparent liquid, and dynamic viscosity of which measured at 25° C. is 325 cps.

$(Me_2HSiO_{1/2})_4(MeSiO_{3/2})_2$      formula (4-1-1)

$CH_2=CHCH_2O(CH_2CH_2O)_5H$      formula (4-1-2)

Comparative Synthesis Example 2: Preparation of a Reactive Organosilicon Thixotropic Agent CE2

300 ml of methylbenzene, 157.8 g (0.3 mol) of the branched hydrogen-containing polysiloxane as represented as formula (5-1-1), 333.6 g (1.2 mol) of the unsaturated polyether as represented as formula (5-1-2) (the ratio of the total quantity of SiH bonds in the cyclic hydrogen-containing polysiloxane to the total quantity of olefinic bonds in the unsaturated polyether is 1:1) and 1.97 g of a platinum catalyst on carbon (20 ppm based on platinum atoms) were sequentially added into a 1000 ml three-necked flask, uniformly mixed and then reacted at 80° C. for six hours with stirring, the platinum catalyst on carbon was removed by filtering, and the methylbenzene is removed by rotary evaporation, so as to obtain the reactive organosilicon thixotropic agent CE2 of the present disclosure, which is a colorless transparent liquid, and dynamic viscosity of which measured at 25° C. is 4860 cps.

$(Me_2HSiO_{1/2})_4(PhSiO_{3/2})_2$      formula (5-1-1)

$CH_2=CHCH_2O(CH_2CH_2O)_5H$      formula (5-1-2)

Embodiments 1 to 3 and Comparative Examples 1 to 2

Raw materials used in Embodiments 1-3 and Comparative Examples 1-2 of the present disclosure are as follows.

Organic polysiloxane (A): the organic polysiloxane having a structure as represented as formula (4-1), where the content of phenyl is 20.9 percent by mass, and the content of ethenyl is 1.92 mmol/g.

$(Me_2ViSiO_{1/2})_{0.34}(Me_2SiO_{2/2})_{0.2}(MeSiO_{3/2})_{1.02}(PhSiO_{3/2})_{0.48}$      (4-1)

Hydrogen-containing polysiloxane (B): the hydrogen-containing polysiloxane as represented as formula (5-1).

$(Me_2HSiO_{1/2})_2(Ph_2SiO_{2/2})_1$      (5-1)

Hydrosilylation reaction catalyst (C): platinum(0)-1,3-divinyl-1,1,3,3-tetramethyldisiloxane complex (the content of platinum is 0.5 wt %).

Filler (D): fumed silicon dioxide, the particle size of which is 14 nm, and the BET specific surface area of which is 230 m²/g.

Reactive tackifier (E1): prepared by Synthesis Example 1.
Reactive tackifier (E2): prepared by Synthesis Example 2.
Reactive tackifier (E3): prepared by Synthesis Example 3.
Reactive tackifier (CE1): prepared by Comparative Synthesis Example 1.
Non-reactive tackifier (CE2): prepared by Comparative Synthesis Example 2.

Tackifier (F): 3-(2,3-epoxypropoxy)propyl trimethoxysilane.

Hydrosilylation reaction inhibitor (G): 1-ethynylcyclohexanol.

The organosilicon encapsulation adhesive of Embodiments 1 to 3 and Comparative Examples 1 to 2 of the present disclosure, which is formulated by the following method according to the composition and proportioning in table 1: uniformly mixing organic polysiloxane, hydrogen-containing polysiloxane, a hydrosilylation reaction catalyst, a filler, a reactive organosilicon thixotropic agent, a tackifier, a hydrosilylation reaction inhibitor (G) in sequence at room temperature, and dispersing the mixture in a planetary mixer for 30 minutes to obtain organosilicon encapsulation adhesive. The relevant assessment results are listed in table 1.

TABLE 1

| Parts by weight | Organosilicon encapsulation adhesive composition | | | | |
| --- | --- | --- | --- | --- | --- |
| | Embodiment | | | Comparative example | |
| | 1 | 2 | 3 | 1 | 2 |
| A | 72 | 72 | 72 | 72 | 72 |
| B | 23.12 | 23.12 | 23.12 | 23.12 | 23.12 |
| C | 0.02 | 0.02 | 0.02 | 0.02 | 0.02 |
| D | 3 | 3 | 3 | 3 | 3 |
| E1 | 0.6 | — | — | — | — |
| E2 | — | 0.6 | — | — | — |
| E3 | — | — | 0.6 | — | — |
| CE1 | — | — | — | 0.6 | — |
| CE2 | — | — | — | — | 0.6 |
| F | 1.2 | 1.2 | 1.2 | 1.2 | 1.2 |
| G | 0.06 | 0.06 | 0.06 | 0.06 | 0.06 |
| Hardness (Shore D) | 52 | 48 | 49 | 45 | 42 |
| Thixotropic index (TI$_0$) | 6.4 | 5.8 | 6.1 | 5.7 | 6.7 |
| Thixotropic index (TI$_3$) | 6.5 | 5.7 | 6.2 | 5.3 | 7 |
| Transmittance (%) | 96.7 | 96.3 | 97.4 | 81.3 | 90.8 |
| Elongation (%) | 32 | 37 | 40 | 35 | 28 |
| Tensile strength (MPa) | 5.3 | 4.9 | 4.8 | 4.4 | 3.3 |
| Shear strength (MPa) | 4.8 | 4.5 | 4.7 | 3.9 | 1.8 |

The organosilicon encapsulation adhesive formulated in Embodiments 1 to 3 of the present disclosure uses reactive organosilicon thixotropic agents E1, E2, E3 respectively, and the reactive organosilicon thixotropic agents are respectively prepared by a hydrosilylation reaction of cyclic hydrogen-containing polysiloxane or branched hydrogen-containing polysiloxane that contains phenyl with unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1. It can be seen from table 1 that, with regard to the organosilicon encapsulation adhesive formulated in Embodiments 1 to 3 of the present disclosure, the transmittance is greater than 95%, and thus great transparency is shown; the Shore D hardness is greater than 45, the tensile strength is greater than 4.5 MPa, and thus great mechanical property is shown; the shear strength is greater than 4.5 MPa, and thus great adhesion property is shown; and above all, an initial thixotropic index, i.e. thixotropic index TI$_0$, is greater than 5.5, a thixotropic index after three months of storage, i.e. thixotropic index $TI_3$, is greater than 5.5, the value change between $TI_0$ and $TI_3$ is relatively small, and thus great thixotropic property is shown and the stability of the thixotropic property is excellent.

It can be seen from comparison that, comparing the organosilicon encapsulation adhesive formulated in Embodiment 3 of the present disclosure with the organosilicon encapsulation adhesive formulated in Comparative Example 1, the difference between the two merely lies in substituents in the reactive organosilicon thixotropic agents used are different, where the reactive organosilicon thixotropic agent E3 used in Embodiment 3 of the present disclosure contains phenyl, whereas the reactive organosilicon thixotropic agent CE1 used in Comparative Example 1 does not contain phenyl. It can be seen from table 1 that since the reactive organosilicon thixotropic agent used does not contain phenyl, the organosilicon encapsulation adhesive formulated in Comparative Example 1 shows lower transparency, mechanical property and adhesive property, and also shows lower thixotropic property and lower stability of the thixotropic property.

It can also be seen from comparison that, comparing the organosilicon encapsulation adhesive formulated in Embodiment 3 of the present disclosure with the organosilicon encapsulation adhesive formulated in Comparative Example 2, the difference between the two merely lies in reactiveness of the reactive organosilicon thixotropic agents used is different, where Embodiment 3 of present disclosure uses the reactive organosilicon thixotropic agent E3, whereas the Comparative Example 2 uses the non-reactive organosilicon thixotropic agent CE2. It can be seen from table 1 that since the organosilicon thixotropic agent used does not have hydrosilylation reactiveness, the organosilicon encapsulation adhesive formulated in Comparative Example 2 shows lower transparency, mechanical property and adhesive property, and also shows lower thixotropic property and lower stability of the thixotropic property.

In summary, in the present disclosure, a reactive organosilicon thixotropic agent is prepared by a hydrosilylation reaction of cyclic hydrogen-containing polysiloxane or branched hydrogen-containing polysiloxane that contains phenyl with unsaturated polyether under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1, can provides the organosilicon encapsulation adhesive with stable thixotropic property, high transparency, and excellent mechanical property and adhesion property at the same time, and thus an LED element having great encapsulation property is manufactured.

The present disclosure is not limited to the above-mentioned implementations, and any modifications, improvements and replacement which can be conceivable to those skilled in the art can fall within the scope of the present disclosure without departing from the substantial content of the present disclosure.

The invention claimed is:

1. A reactive organosilicon thixotropic agent, characterized in being prepared by a hydrosilylation reaction of cyclic hydrogen-containing polysiloxane as represented by formula (1) or branched hydrogen-containing polysiloxane as represented by formula (2) with unsaturated polyether as represented by formula (3) under the condition that the ratio of the total quantity of SiH bonds in the cyclic hydrogen-containing polysiloxane or the branched hydrogen-containing polysiloxane to the total quantity of olefinic bonds in the unsaturated polyether is greater than 1, wherein $$(R^{1a}R^{1b}SiO_{2/2})_{n1}(R^{1c}HSiO_{2/2})_{n2} \quad \text{formula (1)}$$

in formula (1), $R^{1a}$, $R^{1b}$ and $R^{1c}$ are each independently one of a hydrogen atom, methyl and phenyl, and at least one of $R^{1a}$, $R^{1b}$ and $R^{1c}$ is phenyl; and n1 is an integer from 0 to 10, and n2 is an integer from 2 to 10;

$$(R^{2a}R^{2b}R^{2c}SiO_{1/2})_{n3}(R^{2d}R^{2e}HSiO_{1/2})_{n4}(R^{2f}R^{2g}SiO_{2/2})_{n5}(R^{2h}SiO_{3/2})_{n6}(SiO_{4/2})_{n7} \quad \text{formula (2)}$$

in formula (2), $R^{2a}$, $R^{2b}$, $R^{2c}$, $R^{2d}$, $R^{2e}$, $R^{2f}$, $R^{2g}$ and $R^{2h}$ are each independently one of a hydrogen atom, methyl and phenyl, and at least one of $R^{2a}$, $R^{2b}$, $R^{2c}$, $R^{2d}$, $R^{2e}$, $R^{2f}$, $R^{2g}$ and $R^{2h}$ is phenyl; and n3 is an integer from 0 to 10, n4 is an integer from 2 to 10, n5 is an integer from 0 to 10, n6 is an integer from 0 to 10, n7 is an integer from 0 to 10, and n6+n7≥1; and $$AO(BO)_mH \quad \text{formula (3)}$$

in formula (3), A is one of ethenyl, propenyl, allyl, acrylyl and methacryloyl, B is independently one of alkylenes from C1 to C10, and m is an integer from 1 to 50.

2. The reactive organosilicon thixotropic agent according to claim 1, characterized in that the cyclic hydrogen-containing polysiloxane has a structure as represented by the following formula (1-1):

$$(R^{1c}HSiO_{2/2})_{n2} \quad \text{formula (1-1)}$$

wherein in formula (1-1), $R^{1c}$ is each independently a hydrogen atom, methyl and phenyl, and at least one $R^{1c}$ is phenyl; and n2 is an integer from 3 to 10.

3. The reactive organosilicon thixotropic agent according to claim 1, characterized in that the branched hydrogen-containing polysiloxane has a structure as represented by the following formula (2-1):

$$(R^{2d}R^{2e}HSiO_{1/2})_{n4}(R^{2h}SiO_{3/2})_{n6} \quad \text{formula (2-1)}$$

wherein in formula (2-1), $R^{2d}$, $R^{2e}$ and $R^{2h}$ are each independently one of a hydrogen atom, methyl and phenyl, and at least one of $R^{2d}$, $R^{2e}$ and $R^{2h}$ is phenyl; and n4 is an integer from 2 to 10, and n6 is an integer from 1 to 10.

4. The reactive organosilicon thixotropic agent according to claim 1, characterized in that, in formula (3), A is allyl, and B is one of alkylenes from C1 to C4.

5. An organosilicon encapsulation adhesive, characterized by containing:
(A) organic polysiloxane, each molecule of which has at least two SiVi bonds and contains phenyl;
(B) hydrogen-containing polysiloxane, each molecule of which has at least two SiH bonds and contains phenyl;
(C) a hydrosilylation reaction catalyst;
(D) a filler; and
(E) the reactive organosilicon thixotropic agent according to claim 1.

6. The organosilicon encapsulation adhesive according to claim 5, characterized in that the filler (D) is one or more of silicon dioxide, magnesium oxide, aluminium oxide, zinc oxide and titanium oxide.

7. The organosilicon encapsulation adhesive according to claim 5, characterized in that the particle size of the filler (D) is 1 nm to 500 nm.

8. The organosilicon encapsulation adhesive according to claim 5, characterized in that the BET specific surface area of the filler (D) is 100 $m^2/g$ to 800 $m^2/g$.

9. The organosilicon encapsulation adhesive according to claim 5, characterized by containing:
   50 to 90 percent by mass of the organic polysiloxane (A);
   1 to 40 percent by mass of the hydrogen-containing polysiloxane (B);
   0.1 ppm to 500 ppm of the hydrosilylation reaction catalyst (C);
   0.5 to 20 percent by mass of the filler (D);
   0.05 to 10 percent by mass of the reactive organosilicon thixotropic agent (E);
   0 to 10 percent by mass of a tackifier (F); and
   0 to 5 percent by mass of a hydrosilylation reaction inhibitor (G).

10. An LED element, characterized by being prepared by encapsulation using the organosilicon encapsulation adhesive of claim 5.

\* \* \* \* \*